United States Patent [19]

DeMeester et al.

[11] Patent Number: 5,280,247
[45] Date of Patent: Jan. 18, 1994

[54] FILAMENTARY COLD SHIELD FOR SUPERCONDUCTING MAGNETS

[75] Inventors: Gordon D. DeMeester, Wickliffe; Michael A. Morich, Mentor; John L. Patrick, Chagrin Falls, all of Ohio

[73] Assignee: Picker International, Inc., Highland Hts., Ohio

[21] Appl. No.: 859,154

[22] Filed: Mar. 27, 1992

[51] Int. Cl.⁵ .............................. G01R 33/20
[52] U.S. Cl. ......................... 324/318; 335/216
[58] Field of Search ............ 324/300, 307, 309, 318, 324/319, 320, 322; 335/216, 301

[56] References Cited

U.S. PATENT DOCUMENTS

| | | | |
|---|---|---|---|
| 4,833,433 | 5/1989 | Schmettow et al. | 335/216 |
| 4,851,958 | 7/1989 | Takechi | 335/216 |
| 4,868,707 | 9/1989 | Takechi | 335/216 |
| 4,978,920 | 12/1990 | Mansfield et al. | 324/318 |
| 5,045,826 | 9/1991 | Laskaris | 335/301 |
| 5,198,769 | 3/1993 | Frese et al. | 324/318 |

FOREIGN PATENT DOCUMENTS

| | | |
|---|---|---|
| 433002A3 | 12/1990 | European Pat. Off. |
| 4209137A1 | 9/1992 | Fed. Rep. of Germany |
| 2199147A | 12/1987 | United Kingdom |
| 2207764A | 7/1988 | United Kingdom |

*Primary Examiner*—Michael J. Tokar
*Attorney, Agent, or Firm*—Fay, Sharpe, Beall, Fagan, Minnich & McKee

[57] ABSTRACT

An examination region (12) is defined within the bore of a superconducting magnet assembly (10). An RF coil (22) and gradient magnetic field coils (14) are disposed within the bore of the superconducting magnetic assembly around the examination region. The superconducting magnet includes a hollow, tubular vacuum vessel (40) which contains a plurality of annular superconducting magnets (58). These superconducting magnets are held in a liquid helium holding reservoir (60) such that they are held below their superconducting temperature. A first cold shield (44) and a second cold shield (50) have tubular portions between the superconducting magnets and the examination region. These cylindrical portions each include a cylinder (70) of a electrically insulating material such as reinforced plastic. Thermally conductive layers (72) are defined on each surface and are divided by etched slots or resistance portions (74) into a multiplicity of elongated narrow segments (92). The narrow segments are constructed of a thermally conductive material, such as copper or aluminum, that also happens to be electrically conductive. The division of the foil layer into a multiplicity of segments divides the generated eddy currents into a like multiplicity of substantially canceling eddy currents (82) increasing the eddy current path length, increasing the total electrical resistance encountered, and reducing the amplitude and time constant of the resultant net eddy current and eddy magnetic field.

18 Claims, 3 Drawing Sheets

FILAMENTARY COLD SHIELD FOR SUPERCONDUCTING MAGNETS

BACKGROUND OF THE INVENTION

The present invention relates to superconducting magnets. It finds particular application in conjunction with superconducting magnets used in magnetic resonance imaging apparatus and will be described with particular reference thereto. It is to be appreciated, however, that the invention will also find application in other low temperature magnets in applications in which eddy magnetic fields are undesirable, such as nuclear magnetic resonance spectrometers and the like.

Magnetic resonance imaging systems superpose three magnetic fields over an imaging volume. A superconducting magnet is commonly used to provide a spatially large as well as a temporally and spatially constant main magnetic field. This main field is referred to as the $B_0$ field and is usually between 0.5 to 2.0 Tesla within an imaging volume of 50 cm diameter. A second magnetic field changes with time and has spatial linear $\partial B_z/\partial x$, $\partial B_z/\partial y$, $\partial B_z/\partial z$ gradients for spatial encoding that are aligned with the $B_0$ field. These are typically in the range of $+/-10$ mT/m. Transverse to the direction of these two fields is an RF magnetic field used for magnetization reorientation during the NMR experiment.

In a conventional MRI magnet system, a set of $B_0$ field generating coils are configured in such a way that they provide only about a 10 micro Tesla variation within the 50 cm diameter imaging sphere. The coils are typically superconductors operating at a temperature near that of liquid helium, 4.2° K. Typically, between six and eleven superconducting coils are series connected and immersed in a common liquid helium reservoir. In order to minimize the heat gain of the magnet from the room temperature environment, a cryostat is provided. The cryostat is an evacuated container to eliminate convective heat transfer. The magnet is immersed in a liquid helium bath at 4.2° K. and near atmospheric pressure. Between these two containers two cold shields are suspended. One is cooled to about 10°-20° K. by refrigeration and/or the boil off helium gas. The other is typically cooled to about 77° K. Several layers of aluminized mylar minimize the radiative heat transfer. The 77° K. cold shield is either maintained by the boil off of liquid nitrogen or by mechanical refrigeration which can cool it to 60°-70° K. There is also a conductive heat transfer in the suspension members of these internal structures. This is, of course, minimized by design. The cryostat design is thus optimized to provide for a minimum heat gain and thus a minimum helium boil off.

A conventional MRI system surrounds the patient or part of the patient with an RF coil, then the gradient field coil, and finally the room temperature bore of the magnet. Although the cryostat does in general provide an excellent barrier to heat transfer, it also provides electrically conductive materials to support eddy currents from the time changing gradient fields. The magnetic fields resulting from these eddy currents may be substantial and require correction. Conventionally, this is done electrically with pre-emphasis. However, the most effective method is not to create the eddy currents in the first place rather than correcting for them after they are created. This is done with self shielded gradients which consist of a primary set of coils at a first radius as well as a secondary or shield set of coils at a second radius. The design of these coils is such as to minimize the eddy currents at the position of the magnet cold shields as described in U.S. Pat. No. 4,896,129 to Turner, et al. The efficiency of the self shield gradient is strongly influenced by the ratio of the shield coil and primary coil radii, because one partially cancels the field of the other over the imaging volume, in addition to cancelling fields outside of the coils.

There are three general types of superconducting magnets, unshielded, passively shielded, and actively shielded. By design, an unshielded magnet makes no provision to control the field external to the magnet. A passively shielded magnet is designed with iron close to the magnet so as to reduce the spatial extend of the magnet's field. An actively shielded magnet is designed with inner and outer coils (like the self shielded gradient) to minimize the magnetic field outside of the magnet. A hybrid magnet may use some active and some passive shielding. All of these types of magnets require a shimset in order to reach the desired level of homogeneity in the patient volume. A set of Garrett coils can be made to provide the additions to the main field to make the main field more uniform. Some of the coils of this shimset, either superconductive or resistive, can couple to the gradient coil, as does the shield coil of the self shielded gradient. To eliminate these interactions and reduce cost, most MRI systems now have a passive (iron) only shimset. This shimset is located in the room temperature bore of the magnet in the vicinity of the gradient coil.

More specifically, the first or higher temperature cold shields which are traditionally disposed along the patient bore and outside diameters of the vacuum chamber are cooled with liquid nitrogen to about 77° K. For example, a cylindrical liquid nitrogen reservoir is provided inside the vacuum chamber around the outside of the superconducting magnet. The reservoir is thermally connected with a cylinder around the bore and disks at the edges, such that the nitrogen reservoir is cooled by conduction. However, this liquid nitrogen cooling is commonly replaced with mechanical refrigeration. The mechanical refrigeration unit is thermally connected with a copper or aluminum cylinder disposed adjacent the interior diameter of the vacuum chamber and another aluminum or copper cylinder disposed adjacent the outer diameter of the vacuum chamber. The mechanical refrigeration cools these cylinders to a temperature around 60°-70° K., the two cylinders being thermally linked at each end by disks.

To reduce the heat transport, second or inner cold shields are commonly disposed between the first cold shields and the liquid helium vessel. The second cold shields includes one copper or aluminum cylinder disposed between the inner diameter of the superconducting magnets and the inner cylinder of the first cold shield and a second copper or aluminum cylinder disposed between the outer diameter of the superconducting magnets and the outer cylinder of the first cold shield. The cylinder is thermally connected by disks at opposite ends. The second cold shield is thermally connected, such as by thermally conductive metal straps, with a second stage of the refrigeration unit which cools it to about 20° K. Again, the cylinders are surrounded inside and out by layers of the super insulation.

A gradient field coil is disposed in the bore displaced from the inner wall of the cryostat for selectively generating magnetic field gradients across an imaging region in the bore. Typically, the gradient magnetic fields are applied for short durations, sufficiently short that they might more aptly be referenced as magnetic field gradient pulses. The gradient magnetic field pulses, particularly the rising and falling edges of the gradient field pulses, induce voltages in surrounding electrically conductive structures which, in turn, cause eddy currents. That is, eddy currents are generated in the magnet formers, the shimming coils, the liquid helium reservoir, the cold shields, and the like. At the very low resistance found at these temperatures, the eddy currents can persist for periods in excess of the repeat time of the magnetic resonance sequence. The generated eddy currents are very complex, varying with frequency, temperature, thickness of the electrically conductive structure, and the like. These generated eddy currents, in turn, generate eddy magnetic fields in the imaging region in the bore of the magnet. These eddy magnetic fields disrupt the precise magnetic fields that make for good quality, high resolution magnetic resonance imaging.

One technique for compensating for the eddy magnetic fields is through pre-emphasis. During initial pre-emphasis calibration, the contribution from the eddy magnetic fields are determined and the current pulses for generating the gradient magnetic fields adjusted accordingly. More specifically, the currents used to generate the gradient magnetic fields are adjusted such that the generated gradient field and the eddy magnetic field sum to produce the desired magnetic field in the image region. See for example, U.S. Pat. No. 4,761,612 reissued Aug. 2, 1988 to Holland and Stauber entitled "Programmable Eddy Current Correction", and U.S. Pat. No. 4,703,275 issued Oct. 27, 1987 to Holland entitled "Method and Apparatus to Compensate Eddy Currents in Magnetic Resonance Imaging". Although pre-emphasis is effective, it does not completely correct for the complex gradient magnetic fields. The generated eddy magnetic field is very complex and cannot always be completely compensated for with a linear gradient.

One technique for reducing the eddy magnetic fields is to install a self-shielded gradient coil within the warm bore of the superconducting magnet. The self-shielded gradient coils include a gradient coil and a surrounding active shielding coil. The shielding coils are designed to cancel the gradient magnetic field at the positions of the cold shields to prevent inducing eddy currents, hence eddy magnetic fields However, the shield coils generally require a diameter that is about 1.3 times the diameter of the primary gradient coil. This either reduces the size of the usable bore within the gradient coil or requires a larger, more expensive superconducting magnet. For medical diagnostic imaging, the minimum size of the bore is generally dictated by the dimensions of the human torso, hence reducing the useful bore size is undesirable.

The present invention contemplates a new and improved cold shield construction for reducing the amplitude and time constant of the cold shield supported eddy magnetic fields.

SUMMARY OF THE INVENTION

In accordance with the present invention, a new and improved superconducting magnet is provided in which the cold shields are modified to subject induced eddy currents to a significantly higher reactance or resistance.

In accordance with a more limited aspect of the present invention, the cold shields are divided into electrically and thermally conductive strips which are thermally interconnected with a refrigeration means.

In accordance with one embodiment of the present invention, each cylinder of the cold shields includes an electrically insulating substrate which has a highly thermally conductive metal, such as copper or aluminum, on at least one surface thereof. The thermally conductive metal is divided, for example by etching, into a multiplicity of narrow fingers which are thermally interconnected with the refrigeration means.

In accordance with a more limited aspect of the present invention, the strips extend longitudinally, parallel to the axis of the bore of the superconducting magnetic field.

In accordance with another aspect of the present invention, a thin metal coating is applied to both sides of the substrate.

In accordance with another aspect of the present invention, the metal fingers are defined by physically removing metal to define non-conductive boundaries. Alternately, the fingers may be defined by relatively high electrical resistance boundaries. As yet another alternative, a material with a high thermal conductivity and a low electric conductivity, such as epoxy, may be used to interrupt electrical continuity while maintaining thermal continuity.

In accordance with another aspect of the present invention, the fingers are defined by metal reinforcement for a polymeric cylinder.

One advantage of the present invention is that it reduces the amplitude of eddy current contributions from cold shields.

Another advantage of the present invention is that it reduces the time constant of any induced eddy currents. That is, any induced eddy currents decay more rapidly.

Another advantage of the present invention is that it simplifies pre-emphasis correction.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
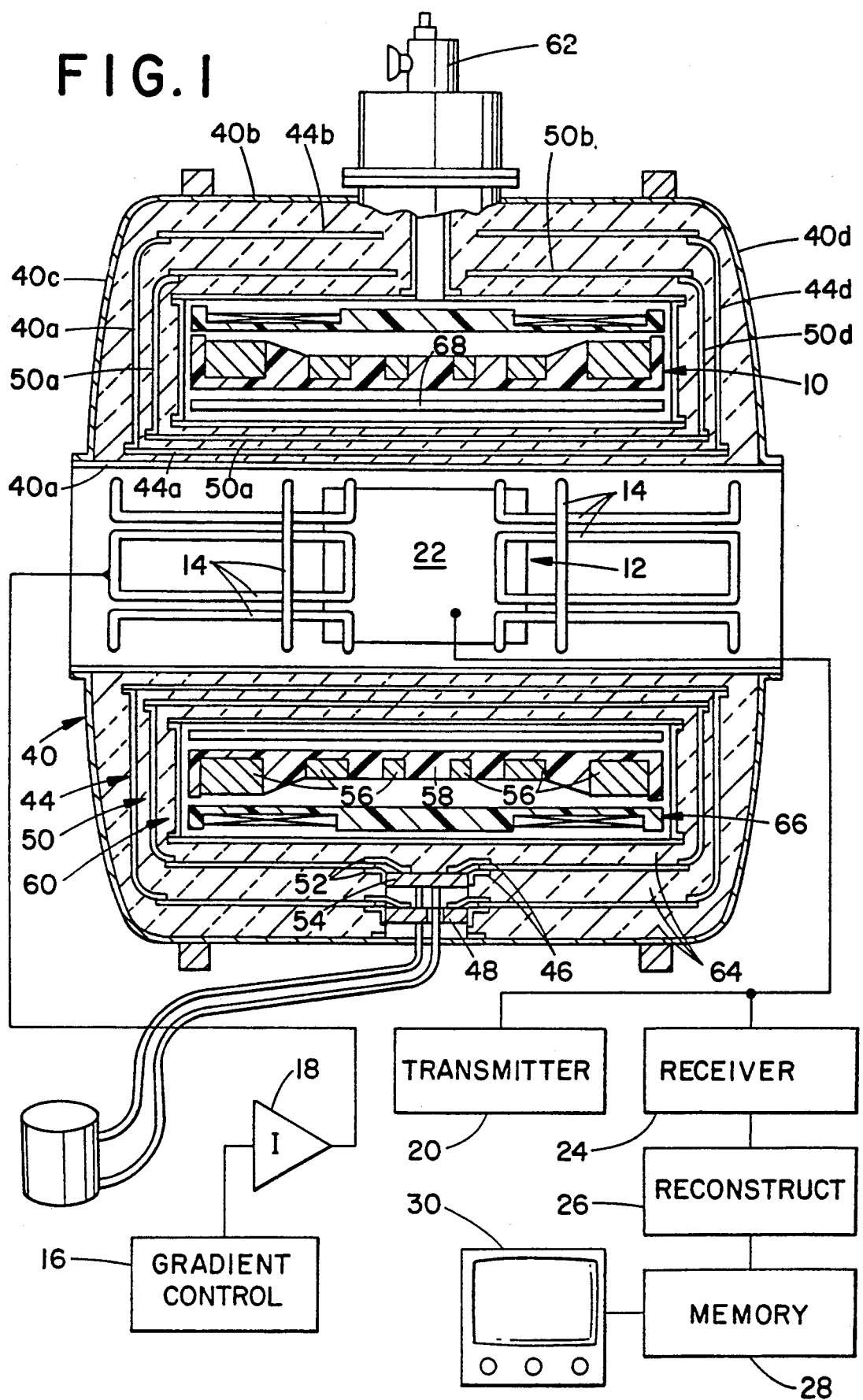
FIG. 1 is a diagrammatic illustration of a magnetic resonance imaging apparatus in partial vertical section through a cryostat and various interior layers of a superconducting main magnet.

With reference to FIG. 1, a superconducting, main magnet field coil assembly 10 generates a substantially uniform magnetic field $B_0$ longitudinally through an examination region 12. A gradient magnetic field means selectively creates gradient magnetic fields $G_x$, $G_y$, $G_z$ across the examination region 12. The gradient magnetic field means includes gradient magnetic field coils 14 arranged symmetrically on either side of the examination region 12. A gradient magnetic field control means 16 controls a current pulse generator 18 to apply current pulses with appropriate characteristics to the gradient field coils to cause a desired magnetic field pulse to be generated.

A resonance excitation and manipulation means includes a radio frequency transmitter 20 for generating radio frequency pulses $B_1$ of the appropriate frequency spectrum for inducing resonance and selected dipoles disposed in the examination region 12 The radio frequency transmitter is connected with a radio frequency antenna 22 disposed surrounding the examination region and inside the main magnetic field magnet 10. The RF coil 22 transmits radio frequency pulses into the region of interest, and receives radio frequency resonance signals emanating therefrom. Alternately, a separate receiving coil may be provided. The received magnetic resonance signals are conveyed to a radio frequency receiver 24. Demodulated received radio frequency signals are digitized and reconstructed into a magnetic resonance image representation by an array processor or other means 26. The reconstructed image representation is stored in a memory 28. The image representation may be displayed on a video monitor 30, subject to further processing, stored on disk, or the like.

The superconducting magnet assembly 10 includes a vacuum vessel 40 which includes an inner cylindrical wall 40a lining its bore, an outer wall 40b around the outer diameter of the assembly, and annular end walls 40c and 40d. A port is provided for initially evacuating the vessel 40.

A first cold shield 44 includes an inner cylindrical shield assembly 44a in the inner bore of the magnet adjacent the bore wall 40a of the vacuum vessel, and an outer cylindrical assembly 44b adjacent the outer diameter wall 40b of the vacuum vessel. Preferably, the first cold shield 44 further includes annular end wall shield assemblies 44c and 44d. The first cold shield is connected by an array of thermal conductors 46, such as braided strips of copper, aluminum, or other highly conductive materials to a first heat sink 48 which is refrigerated to about 60°-70°K.

A second cold shield 50 includes an inner cylindrical shield assembly 50a disposed adjacent the first cold shield in shield assembly 44a and an outer cylindrical shield assembly 50b disposed adjacent the first cold shield outer cylindrical shield assembly 44b. Preferably, annular ends 50c and 50d complete the containment. The second cold shield 50 is connected by thermally conductive cables or other means 52 with a second heat sink 54 which is refrigerated to about 40° K. or less.

Preferably, a helium working gas is compressed at a remote location by mechanical means. The helium is conveyed to a cold head within which the first and second heat sinks are located. The compressed, helium is allowed to expand in a two stage process removing heat from the heat sinks.

A plurality of superconducting, annular magnet coils 56 mounted on a dielectric former 58 are disposed within a low temperature reservoir 60 inside of the inner cold shield 50. The low temperature reservoir 60 is sealed from the remainder of the vacuum vessel 40 such that it holds the superconducting magnets immersed in liquid helium without the helium escaping into the evacuated region. A helium port 62 permits the low temperature reservoir 60 to be maintained filled with liquid helium as it evaporates to hold the temperature in the helium vessel 60 at about 4.2° K. Optionally, a helium recovery and recirculating system (not shown) may be connected with the helium port 62 to recover evaporating helium, recondense it to liquid, and refill the helium reservoir 60. Layers 64 of insulation, preferably aluminized mylar, are disposed between the vacuum vessel walls and the first cold shield, between the first and second cold shields, and between the second cold shield and the helium reservoir.

A superconducting main field shield coil assembly 66 is mounted in the helium vessel around the exterior of the superconducting main magnets 56 and electrically in series therewith. The shield coil generates a magnetic field which opposes the fields generated by main magnets 56 exterior of the bore. Preferably, the superconducting coils 56 and 66 interact to produce a strong uniform magnetic field in the bore with substantially reduced magnetic field external to the cryostat. Analogously, a superconducting gradient field shield coil 68 can be mounted in the helium reservoir inside the main superconducting magnets to shield them from gradient fields. Preventing the main magnets and structures radially therebeyond from seeing the gradient fields prevents the gradient fields from inducing eddy currents in the shielded structure.

Figure 2:
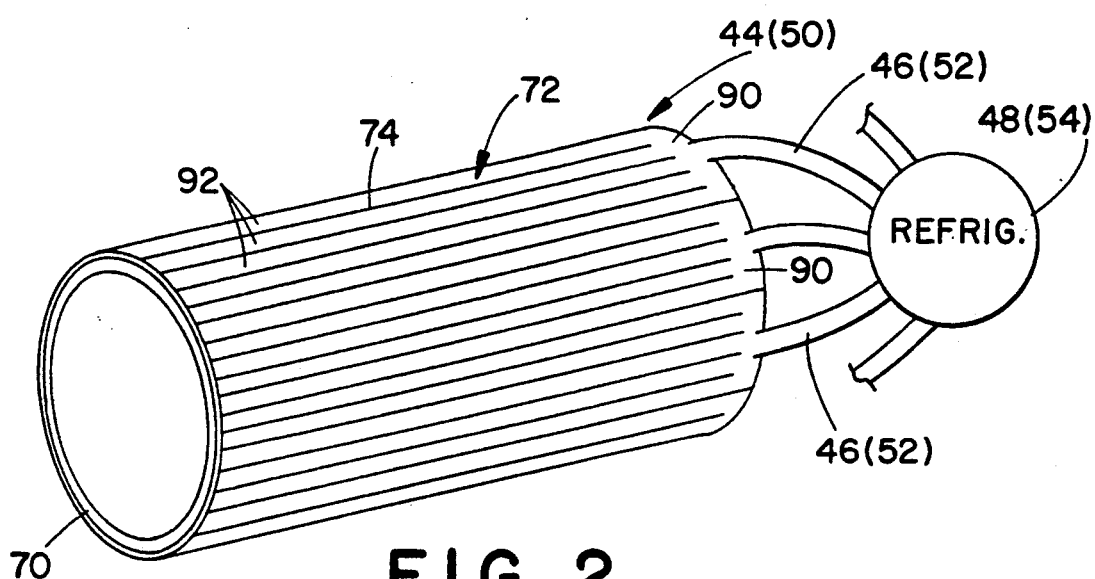
FIG. 2 is a diagrammatic illustration of one of the cold shields of the present invention.
Figure 3:
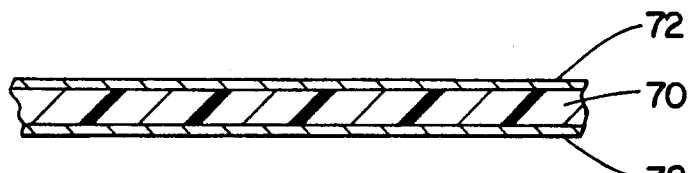
FIG. 3 is a sectional view through the cold shield of FIG. 2.

With continuing reference to FIG. 1, and particular reference to FIGS. 2 and 3, each of the cold shields is constructed from a laminated structure having a non-ferrous, electrically insulating inner core 70, and a highly, thermally conductive surface covering 72 on one or both faces of the core. In a whole body magnet, the cold shields are 1-2 m. long and have diameters of about 1 m. and 1.5 m. In the preferred embodiment, the thermally conductive outer layer(s) 72 is copper or aluminum, which also happens to be electrically conductive. More specifically to the preferred embodiment, the cold shields are constructed from a circuit board type material in which the inner core 70 is a glass reinforced polymeric material and the thermally conductive covering 72 is a layer of copper or aluminum that is about 1-2 mm thick. Optionally, the core 70 may include carbon fibers or fibers which have more thermal conductivity than glass.

The electrically conductive outer layers 72 include an array of electrical insulation means 74 for dividing the outer layer into a plurality of segments. In the preferred embodiment, the electrical insulating means are longitudinal gaps which are defined by a conventional etching process. Preferably, the strips are about 4 mm wide and separated by a 2 mm gap. However, other techniques are also contemplated, such as by chemically reacting or physically treating the copper or aluminum layer to render it less electrically conductive. For example, narrow strips of aluminum may be oxidized to form relatively electrically insulating aluminum oxide. Analogously, relatively electrically insulating particles may be embedded along predefined paths in the conductive layer 72. As another option, strips of thermally conductive, electrically resistive ceramic material, such as diamond, carbon, and the like, can be alternated with metallic strips. The layer is divided such that each segment is in thermal communication with one of the straps 46, 52 which connects the cold shield with its respective refrigeration means.

Figure 4:
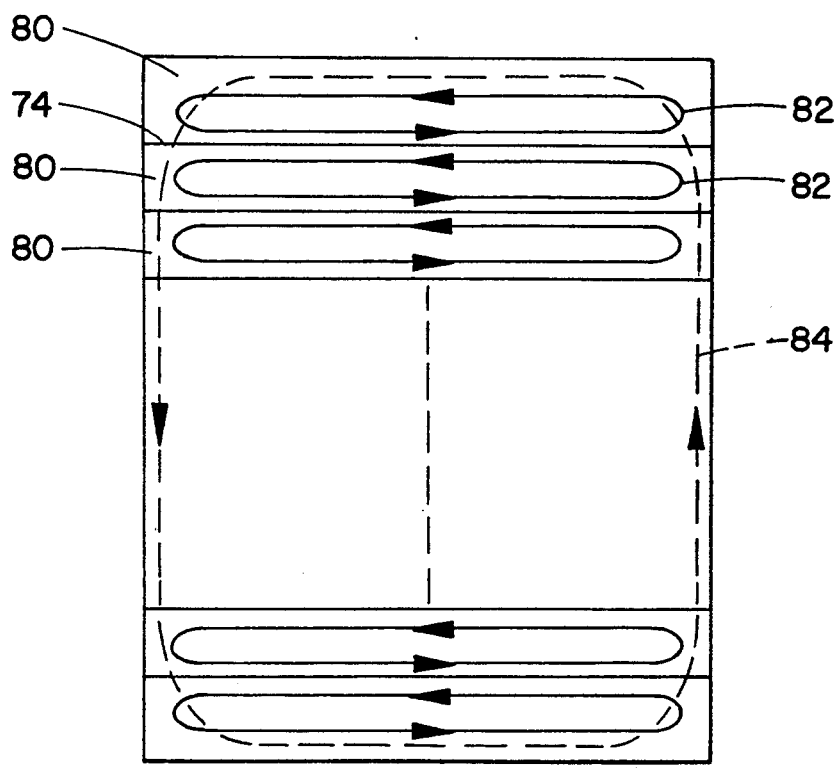
FIG. 4 is an enlarged view of the portion of the cold shield illustrating induced eddy currents.

With reference to FIG. 4, the electrical insulating means divides the conductive layers into a multiplicity of long, narrow strips 80. In response to the magnetic gradient pulse, each strip can support an eddy current 82. Because eddy current flows in opposite directions on either side of the electrical insulating means 74 have a canceling effect, the net eddy current is substantially a current loop 84. Indeed, an eddy current analogous to 84 would be generated in the absence of the electrical dividers. However, the path length of the sum of the eddy currents 82 is almost as many times longer than the path length 84 as the number of segments 80. Stated conversely, the net electrical resistance along the path lengths 82 is about as many times higher than the net electrical resistance along the path length 84 as the number of path segments so. Hence, the amplitude of the sum of the currents 82 is smaller than the amplitude of a single current loop 84 by the inverse of the number of segments.

It is further to be appreciated that there is a capacitive and inductive coupling between the fingers or segments. Thus, the eddy currents and resultant eddy magnetic fields are attenuated not only by resistance of the metal but also by inductive and capacitive reactance.

Figure 5:
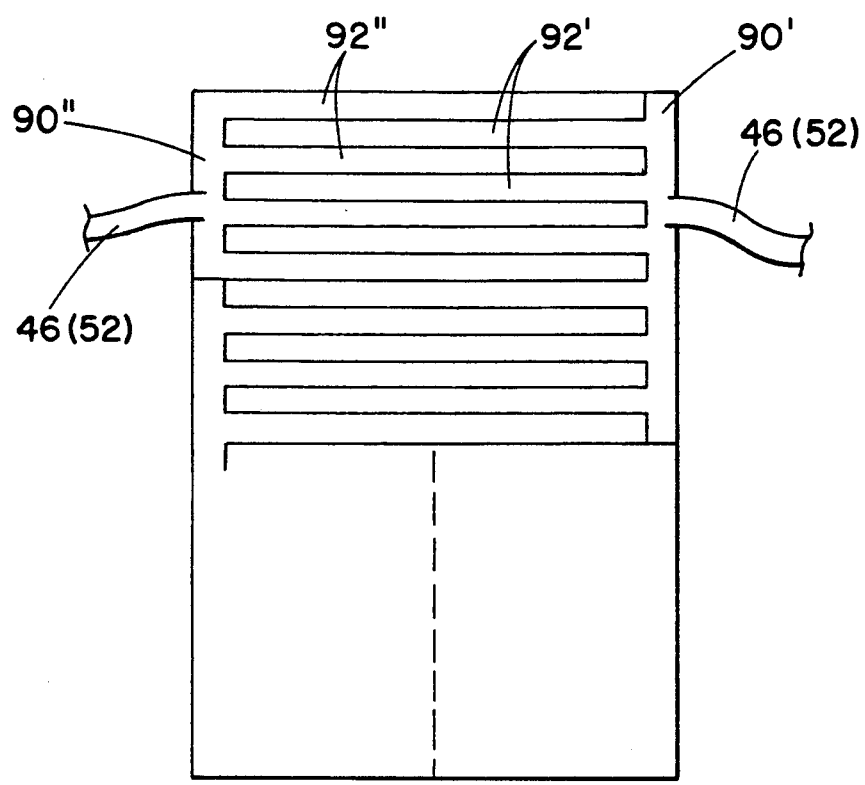
FIG. 5 is an alternate pattern for etching the heat shields of FIG. 2.
Figure 6:
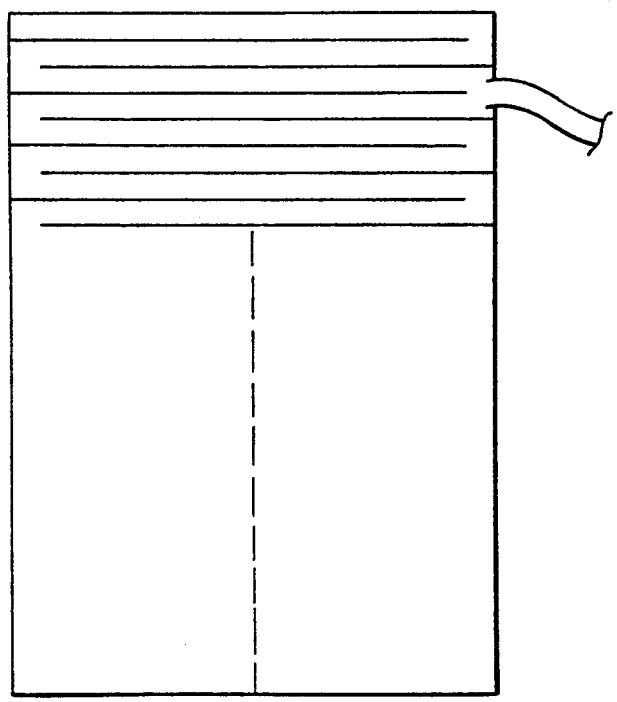
FIG. 6 is another alternate etching pattern for the cold shields.

With reference to FIGS. 2, 5, and 6, various conductive segment patterns are contemplated. Preferably, the segments are elongated parallel to a central axis of the magnet. This limits eddy currents from the gradient fields $G_x$, $G_y$, and $G_z$ substantially to the z direction. Eddy magnetic fields caused by eddy currents flowing in the z direction parallel to the central bore, i.e. parallel to the $B_0$ field, have a minimal effect on the magnetic resonance experiment. Eddy currents flowing along the cold shield in the z direction cannot generate a magnetic component in the z direction, minimizing any effect on an imaging procedure.

With reference to FIG. 2, one effective pattern is a comb type pattern. That is, series of common arc segments 90 extend along a portion of one edge. Each arc segment is interconnected with a multiplicity of fingers 92. The arc segments are electrically separated by gaps or other electrical insulators 74.

With reference to FIG. 5, another effective pattern is an interleaved comb pattern. That is, arc segments 90' and 90" are defined along segments opposite edges of the cold shields. Alternate fingers 92' and 92" are connected with the arc segments 90' and 90", respectively. One of the thermal conducting straps 46, 52 is interconnected with each arc segment.

With reference to FIG. 6, another pattern is a plurality of segments interconnected at opposite ends such that a long S-type pattern is defined.

As yet further alternatives, the arc segments and the longitudinal conductor portions can be divided by electrically non-conducting, thermally conducting materials, e.g. diamond. By inserting small diamond or other thermally conductive ceramic segments to divide the arc segments from each other, thermal conductivity around the peripheral edges can be maintained while disrupting electrical conductivity. Similarly, the ceramic inserts can connect the arc segments to the longitudinal segments.

Yet other patterns for the segments are contemplated. Rather than etched thin film material, the segments may be defined by relatively thick wires, beams, or the like. Moreover, segments disposed along the diagonal, particularly segments along opposite diagonals on the inside and outside surfaces may also have advantageous results. Rather than defining the conductive layer on the exterior of the former 70, the conductive portions may be defined within the former. For example, the polymeric cylinder 70 can be reinforced with diagonally wound copper or aluminum strands or blends of metal and ceramic fibers. As another alternative, the cooling shields may be defined by circuit board materials with multiple, internal layers of conductive and non-conductive materials.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance apparatus comprising:
   a radio frequency coil disposed around an examination region;
   a gradient coil assembly disposed adjacent the examination region;
   a means for causing the gradient magnetic field coil assembly to generate gradient magnetic field pulses and for causing the radio frequency coil to emit radio frequency pulses;
   a superconducting magnet assembly surrounding the examination region and defining a bore within which the radio frequency coil and the gradient coil assembly are received, the superconducting magnet assembly including:
   a cylindrical vacuum vessel having an inner wall along the bore;
   at least one annular superconducting magnet disposed within the vacuum vessel;
   a low temperature reservoir surrounding the annular superconducting magnet and containing a medium for holding the superconducting magnet at or below its superconducting temperature, the low temperature reservoir being received in and spaced from the vacuum vessel;
   at least one cold shield disposed between the low temperature reservoir and the vacuum vessel inner wall, the cold shield including a means for defining a cylinder and a multiplicity of thermally conductive segments disposed along the cylinder defining means, and a means for thermally connecting the segments of the cold shield with a cooling means.

2. The apparatus as set forth in claim 1 wherein the cooling means includes a refrigeration means that cools by at least one of (i) mechanical refrigeration and (ii) helium boil off.

3. The apparatus as set forth in claim 1 wherein the cold shield cylinder defining means includes a cylinder of a dielectric material, the multiplicity of conductive segments being supported by the cylinder.

4. The apparatus as set forth in claim 3 wherein the conductive segments include elongated metal segments.

5. The apparatus as set forth in claim 4 wherein the metal segments extend generally parallel to a longitudinal axis of the bore.

6. The apparatus as set forth in claim 5 wherein the elongated segments are defined by metallic foil on at least one of an outer surface of the dielectric cylinder and an inner surface of the dielectric cylinder.

7. The apparatus as set forth in claim 5 wherein a plurality of the segments are interconnected adjacent one end of the cylinder and further including an electrical insulating means for interrupting an electrically conductive path around the one end of the cylinder.

8. The apparatus as set forth in claim 7 wherein the elongated segments are defined by metallic foil on at least one of an outer and an inner surface of the dielectric cylinder.

9. The apparatus as set forth in claim 1 wherein the superconducting magnet assembly further includes a second cold shield disposed between the first cold shield and the low temperature reservoir, the second cold shield including:
   a means for defining a cylinder and a multiplicity of thermally conductive segments disposed along the cylinder defining means;
   a means for thermally connecting the second cold shield conductive segments with the cooling means: and
   insulation disposed between the first and second cold shields, the vacuum vessel inner wall, and the low temperature reservoir.

10. The apparatus as set forth in claim 9 wherein the second cold shield cylinder defining means includes a cylinder of a dielectric material, the multiplicity of conductive segments being supported by the cylinder.

11. The apparatus as set forth in claim 10 wherein the conductive segments include elongated metal segments.

12. The apparatus as set forth in claim 11 wherein the metal segments extend generally parallel to a longitudinal axis of the bore.

13. The apparatus as set forth in claim 12 wherein the elongated segments are defined by metallic sheet on a surface of the dielectric cylinder.

14. The apparatus as set forth in claim 12 wherein a plurality of the metal segments are interconnected adjacent one end of the cylinder and further including an electrical insulating means for interrupting an electrically conductive path around the one end of the cylinder.

15. The apparatus as set forth in claim 1 further including a reconstruction means for reconstructing an image representation from magnetic resonance signals received in the bore.

16. A method of reducing eddy magnetic field degradation in a magnetic resonance apparatus which includes a cylindrical vacuum vessel having an inner wall that defines an inner bore, a radio frequency coil and a gradient coil assembly disposed within the bore, a means for causing the gradient magnetic field coil assembly to generate gradient magnetic field pulses and for causing the radio frequency coil to emit radio frequency pulses, at least one annular superconducting magnet disposed within a vacuum vessel, a means surrounding the superconducting magnet for holding the superconducting magnet at or below its superconducting temperature and at least one cold shield disposed between the superconducting magnet and the vacuum vessel inner wall, the cold shield defining a cylindrical surface that supports a metal sheet, and a means for thermally connecting the metal sheet of the cold shield with a cooling means, the method comprising:
   dividing the cold shield metal surface into a multiplicity of long, narrow regions such that induced eddy currents are confined to long, narrow eddy current loops in the elongated regions, the elongated regions being arranged such that the eddy current loops generate substantially canceling magnetic fields, whereby paths of the induced eddy currents are elongated, increasing resistance thereto and more rapidly attenuating the induced eddy currents.

17. The method as set forth in claim 16 wherein the dividing step includes etching a layer of metal to define electrically insulating discontinuities therein to define the elongated regions.

18. The method as set forth in claim 16 wherein, in the dividing step, the metal is divided such that the elongated regions extend substantially parallel to a central axis of the bore.

* * * * *